United States Defensive Publication [19] (H) [11] T961,007

Jukes et al. [43] Aug. 2, 1977

[54] PRODUCTION OF ELECTRICALLY CONDUCTIVE PATHS ON AN INSULATING SUBSTRATE

[75] Inventors: Alan William Jukes, St. Albans; Michael John Packham, Welwyn Garden City, both of England

[73] Assignee: Imperial Chemical Industries Limited, London, England

[21] Appl. No.: 712,373

[22] Filed: Aug. 6, 1976

[30] Foreign Application Priority Data

Aug. 12, 1975 United Kingdom ..... 33542/75

[51] Int. Cl.[2] ..... H05K 3/18

[52] U.S. Cl. ..... 427/54; 427/98; 427/265; 427/12; 427/306; 427/404; 96/38.4

[57] ABSTRACT

This process applies to printed circuits obtained by the imagewise deposition of nickel using a procedure such as that described in U.S. Pat. No. 3,853,589 followed by electroless copper plating onto the nickel pattern. We have found that by depositing the nickel before the copper, as compared with direct deposition of the copper, gives less deposition on the areas between the conductive paths and hence better insulation between them.

The process can be performed in five stages including (a) coating a substrate, for instance by a gravure technique, with an active agent including a water-soluble quaternized bipyridilium compound, e.g. N,N′-dimethyl-4,4′-bipyridilium dimethosulphate or N,N′-bis(4-cyanophenyl)4,4″-bipyridilium dichloride and a suitable binder therefore such as polyvinyl alcohol, (b) imagewise exposing the coating where the conductive paths are to be deposited to sensitizing radiation, (c) contacting the surface with a solution of palladium chloride in hydrochloric acid, preferably containing 0.5 to 0.15 g/l $PdCl_2$, (d) contacting the substrate with an aqueous electroless nickel plating bath, preferably at pH 8 to 9, and (e) contacting the substrate with an electroless copper plating bath.

Further reduction in the metal deposition between the conductive paths is obtained by contacting the surface of the substrate with an aqueous solution of a reducing agent such as sodium hypophosphite between steps (c) and (d), rubbing the surface of the substrate between steps (d) and (e), or both procedures.

8 Claims, No Sheets Drawing,

12 Pages Specification

The file of this unexamined application may be inspected and copies thereof may be purchased (849 O.G. 1221, Apr. 9, 1968).